(12) United States Patent
Deshaye

(10) Patent No.: US 9,370,824 B2
(45) Date of Patent: Jun. 21, 2016

(54) LATHE HEAD FOR NANO/MICRO MACHINING OF MATERIALS

(71) Applicant: Patrick J Deshaye, Hillsboro, OR (US)

(72) Inventor: Patrick J Deshaye, Hillsboro, OR (US)

(73) Assignee: Norsam Technologies, Inc., Santa Fe, NM (US)

( * ) Notice: Subject to any disclaimer, the term of this patent is extended or adjusted under 35 U.S.C. 154(b) by 559 days.

(21) Appl. No.: 13/842,899

(22) Filed: Mar. 15, 2013

(65) Prior Publication Data

US 2013/0276599 A1    Oct. 24, 2013

Related U.S. Application Data

(60) Provisional application No. 61/636,639, filed on Apr. 21, 2012.

(51) Int. Cl.
*B23K 26/08* (2014.01)
*B23K 26/36* (2014.01)
*B23B 5/00* (2006.01)
(Continued)

(52) U.S. Cl.
CPC ............ *B23B 5/00* (2013.01); *B23K 26/0072* (2013.01); *B23K 26/0075* (2013.01); *B23K 26/0823* (2013.01); *B23K 26/362* (2013.01); *B81C 99/001* (2013.01); *H01J 37/3056* (2013.01); *B23K 26/0066* (2013.01); *B23K 26/08* (2013.01); *B23K 26/36* (2013.01); *H01J 2237/2007* (2013.01); *H01J 2237/20214* (2013.01);
(Continued)

(58) Field of Classification Search
CPC .......... B23K 26/0066; B23K 26/0072; B23K 26/0075; B23K 26/08; B23K 26/0823; B23K 26/36; B23K 26/362; H01J 37/305; H01J 37/3056

USPC ............ 219/121.67–121.72, 121.82, 121.85, 219/121.19, 121.2, 121.31
See application file for complete search history.

(56) References Cited

U.S. PATENT DOCUMENTS 2,375,092 A * 5/1945 Emanuel ............. G04D 3/0263
29/76.1
2,861,166 A    11/1958 Cargill, Jr.
(Continued)

OTHER PUBLICATIONS

Bhavsar, Sanket N et al, A Critical Review on Microtools Fabrication by Focused Ion Beam (FIB) Technology), Proceedings of the World Congress on Engineering 2009 vol. II WCE 2009, Jul. 1-3, 2009, London, U.K.
(Continued)

*Primary Examiner* — Samuel M Heinrich
(74) *Attorney, Agent, or Firm* — Franklin & Associates International Inc; Matthew F. Lambrinos

(57) ABSTRACT

Apparatus, methods and systems for nano/micro machining. A lathe head has a microscopic pivot aperture for seating a conical tip. The conical tip is carried on a turnable part at one end thereof and is polished down to a microscopic apex. The microscopic pivot aperture is dimensioned for seating the concentric tip in the pivot aperture such that an apex of the conical tip protrudes through and beyond the aperture to a position in close proximity with the aperture. A driver system can comprise a rotator for axially rotating the turnable part, including the conical tip seated in the pivot aperture, and a forward pressure applicator for concurrently applying forward pressure to the conical tip in the direction of the pivot aperture. A light/particle beam system can be utilized to machine the rotating conical tip and the rotating turnable part, including the tip, can be easily removed after machining.

8 Claims, 10 Drawing Sheets

(51) Int. Cl.
*B81C 99/00* (2010.01)
*B23K 26/00* (2014.01)
*H01J 37/305* (2006.01)

(52) U.S. Cl.
CPC ........ *H01J2237/31749* (2013.01); *Y10T 82/10* (2015.01); *Y10T 82/2552* (2015.01)

(56) References Cited

U.S. PATENT DOCUMENTS

| | | | |
|---|---|---|---|
| 3,573,098 | A | 3/1971 | Bieber |
| 4,689,467 | A | 8/1987 | Inoue |
| 6,578,254 | B2* | 6/2003 | Adams ................ H01F 17/0033 216/18 |
| 7,109,483 | B2 | 9/2006 | Nakasuji et al. |
| 7,602,822 | B2* | 10/2009 | Lizotte ............... B23K 26/0604 219/121.61 |
| 8,076,609 | B2 | 12/2011 | Oberg |
| 2006/0113475 | A1 | 6/2006 | Moore |
| 2008/0149474 | A1 | 6/2008 | Liu |
| 2010/0064538 | A1 | 3/2010 | Scarsbrook et al. |
| 2010/0272506 | A1 | 10/2010 | Honma |
| 2011/0309553 | A1 | 12/2011 | Huff |
| 2012/0112090 | A1 | 5/2012 | Henstra |

OTHER PUBLICATIONS

Tseng, Ampere A et al, Recent developments in micromilling using focused ion beam technology, Institute of Physics Publishing Journal of Micromechanics and Microengineering, Published Jan. 19, 2004 Online at stacks.iop.org/JMM/14/R15 (DOI: 10.1088/0960-1317/14/4/R01), J. Micromech. Microeng. 14 (2004) R15-R34 PII: S0960-1317(04)64698-5.

Alting, L et al., Micro Engineering, Department of Manufacturing Engineering and Management, Technical University of Denmark,Department of Precision Machinery Engineering, The University of Tokyo, Japan, CIRP Annals—Manufacturing Technology 52 (2) (2003) 635-657.

David P. Adams et al, Micromilling of metal alloys with focused ion beam-fabricated tools, Precision Engineering Journal of the International Societies for Precision Engineering and Nanotechnology 25 (2001) 107-113.

M.J.Vasile et al, Microfabrication techniques using focused ion beams and emergent applications, Micron 30 (1999) 235-244.

Zinan Lu, et al. Micro cutting in the micro lathe turning system, International Journal of Machine Tools & Manufacture 39 (1999) 1171-1183.

Y.N. Picard et al, Focused ion beam-shaped microtools for ultra-precision machining of cylindrical components, Precision Engineering 27 (2003) 59-69.

Chung-Soo Kim, Review: Developments in micro/nanoscale fabrication by focused ion beams, Vacuum 86 (2012) 1014-1035.

* cited by examiner

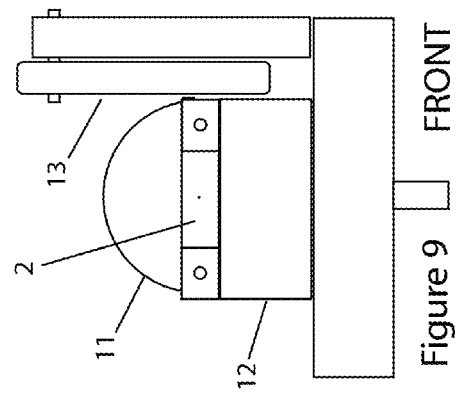
Figure 9 FRONT
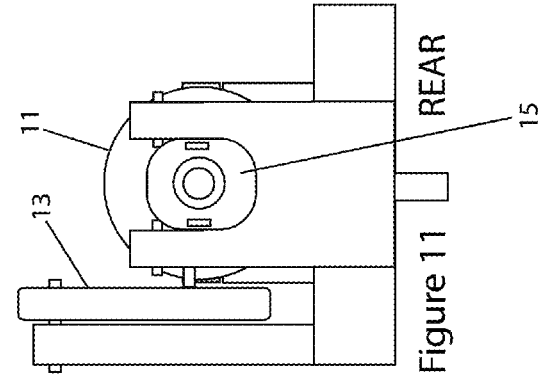
Figure 11 REAR
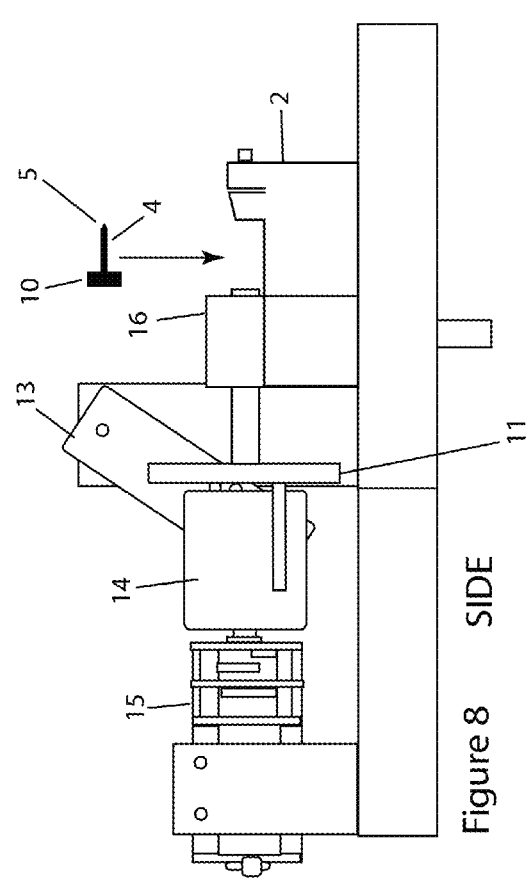
Figure 8 SIDE
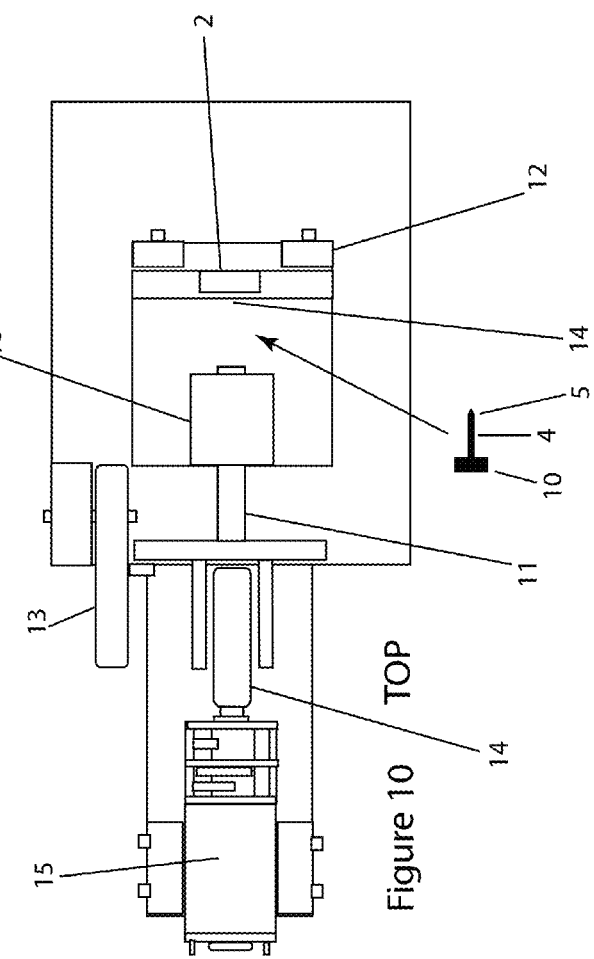
Figure 10 TOP The Exposure (EXP) of the Apex = Height of Conical (h) - Aperture Thickness (X)

$$EXP = [(Dia/2) \times 1/tan(CA/2)] - X$$

LATHE HEAD FOR NANO/MICRO MACHINING OF MATERIALS

This application claims priority under 35 U.S.C. 119(e) to U.S. Provisional patent application No. 61/636,639, which was filed on Apr. 21, 2012, the disclosure of which is incorporated herein by reference in its entirety.

TECHNICAL FIELD

Embodiments relate to micro/nano machining tools and techniques and, more particularly but not exclusively, to micro/nano machining tools for use in focused ion beam machining systems and laser beam machining systems.

BACKGROUND

Microscopic projecting features of specialized geometries are employed in a variety of industries today: tiny probes only a few microns in length fabricated from various materials are utilized in imaging, metrology, and increasingly in the growing nanomechanical testing industry.

Examples of micromachining technology are Focused Ion Beam (FIB) technology and Laser Beam machining technology. FIB is prominently employed in the creation of such microscopic projecting features. Many industrial and research applications can perform their work with tri-faceted (e.g. Berkovich and cube-corner nanoindenters) or columnar geometries (which are rather easily fabricated using well known FIB techniques). However, more specialized and unique features are required for modern micro and nanomechanical systems. For example, specialized projecting features, particularly made from diamond and other hard materials, are required for nanomechanical systems employed in hardness testing and tribology at the nanoscale. Among these are fully conical probes of very small but consistent diameter, which may support hemispherical apices down to submicron radii of curvature. These sorts of features present numerous difficulties for microscopic production by FIB or any other micromachining means. For example, microscopic production using a FIB in "lathe mode" is one example of microscopic production but this requires the use of elaborate and costly software and expert scripting of existing FIB stage operations and ion beam patterning.

There is a need to provide improved apparatus and methods for micro/nano machining a variety of parts in diamond and other materials in a simple, straightforward and economical manner.

SUMMARY

According to one aspect, an apparatus for a micro/nano machining lathe system is provided. The apparatus can have a lathe head for retaining in a micro/nano machining lathe system. The lathe head can comprise a microscopic pivot aperture for seating a conical tip. The conical tip is carried on a turnable part at one end thereof and is polished down to a microscopic apex. The microscopic pivot aperture is dimensioned for seating the concentric tip in the pivot aperture such that an apex of the conical tip protrudes through and beyond the aperture to a position in close proximity with the aperture. A driver system can comprise a rotator for axially rotating the turnable part, including the conical tip seated in the pivot aperture, and a forward pressure applicator for concurrently applying forward pressure to the conical tip in the direction of the pivot aperture. In use, when the driver system axially rotates, and applies the forward pressure to, the turnable part, including the conical tip seated in the aperture, the pivot point of the conical tip is substantially fixed by the aperture and eccentric runout of the rotating conical tip apex is substantially minimized for micro/nano machining of the tip material.

According to another aspect, an apparatus for a micro/nano machining lathe is provided. The apparatus can comprise a turnable part, a lathe head and a driver system. The turnable part supports at one end thereof a polished conical tip of material; the conical tip being polished down to a microscopic apex. The lathe head for retaining in a micro/nano machining lathe system comprises a microscopic pivot aperture dimensioned for seating the conical tip concentric in the pivot aperture such that an apex of the conical tip protrudes through the aperture to a position in close proximity with the aperture. The driver system comprises a rotator for axially rotating the turnable part, including the conical tip seated in the pivot aperture, and a forward pressure applicator for concurrently applying forward pressure to the conical tip in the direction of the pivot aperture. When in use, the drive system maintains axial rotation of, and forward pressure to, the turnable part, including the conical tip seated in the aperture, such that eccentric runout at the apex of the rotating conical tip is substantially minimized and such that the pivot point of the protruding apex remains fixed for micro/nano machining.

According to another aspect, there is provided a method for micro/nano machining; the method comprising providing a turnable part carrying at one end a conical tip of material; the conical tip being polished down to a microscopic apex; seating, apex first, the conical tip in one end of a pivot aperture of a lathe head and concentric with the aperture such that the apex protrudes from the other end of the aperture to a position in close proximity with the aperture; retaining the lathe head in a micro/nano machining lathe system; axially rotating the turning part, including the conical tip seated in the aperture; and concurrently applying forward pressure to the axially rotating conical tip seated in the pivot aperture and in the direction of the aperture; whereby eccentric runout at the apex of the rotating conical tip is substantially minimized such that a pivot point of the protruding apex remains fixed for micro/nano machining of the apex.

According to yet another aspect, an apparatus for micro/nano machining is provided. The apparatus can comprise a micro/nano machining lathe and a micro/nano machining light/particle beam system. The micro/nano machine lathe comprises a lathe head comprising a microscopic pivot aperture for seating a conical tip, the conical tip being carried on a turnable part at one end thereof and being polished down to a microscopic apex. The microscopic pivot aperture is dimensioned for seating the concentric tip in the pivot aperture such that an apex of the conical tip protrudes through and beyond the aperture to a position in close proximity with the aperture. The lathe further comprises a driver system comprising a rotator for axially rotating the turnable part, including the conical tip seated in the pivot aperture, and a forward pressure applicator for concurrently applying forward pressure to the conical tip in the direction of the pivot aperture such that eccentric runout at the apex of the rotating conical tip is substantially minimized. At least one light/particle beam source of the micro/nano machining light/particle beam system is configured for directing a light/particle beam onto the conical tip protruding through the aperture. In use, when the drive system maintains axial rotation of, and or forward pressure to, the conical tip seated in the aperture, the light/particle beam system performs nano/micro machining of the rotating conical tip whilst a pivot point of the conical tip apex remains substantially fixed. In one embodiment, the light/particle beam system may comprise a focus ion beam system. In another light/particle beam system may comprise a laser beam system.

According to another aspect, a method for micro/nano machining; the method comprises providing a turnable part supporting at one end thereof a polished conical tip of material; the conical tip being polished down to a microscopic apex; seating, apex first, the conical tip concentric in a pivot aperture of a lathe head such that the apex of the conical tip protrudes through the aperture to a position in close proximity with the aperture; and axially rotating the turnable part, including the conical tip seated in the pivot aperture, and concurrently applying forward pressure to the conical tip in the direction of the pivot aperture such that during rotation eccentric runout at the apex of the rotating conical tip is substantially minimized.

The aforementioned apparatus and methods of the embodiments can for example include one or more of the following exemplary technical features. By way of example, the conical tip and turning part may be removeably seatable in the pivot aperture. In one example, the aperture is a conductive and is electrically grounded for limiting charging of the apex during micro/nano machining. The apex of the conical tip can have different radii in the micro range, such as for example but not limited to a radius of curvature in the 1-10 um range such as about 3-5 um. In one example the radius of curvature can be in the nano range. The aperture may be of a diameter in the range of approximately 300 um or less. In one example the conical tip of material may comprise a diamond conical tip. In one example, the aperture may be formed from a conductive sheet of material. In another example, part of the conical tip may alternatively or additionally be made conductive. The turnable part can comprise a shank. The conical tip may be formed from a material that has been brazed on to an end of the shank.

In another example, the turnable part and conical tip can be one piece of the material. The rotator of the drive system may be configured for rotating an opposite end of the shank. In one example, a fixed guide or bushing is provided for guiding the shank or other turnable part such that the conical tip is guided to seat in the pivot aperture.

According to one embodiment, an apparatus for micro/nano machining comprises a microscopic or near microscopic metallic aperture and a metallic shank about a few millimeters in length supporting a conical apex of polished diamond or other material, such as corundum, vanadium carbide, etc. The metallic aperture can be for example a metallic aperture of the type adopted in electron optics or photonic applications. The shank and supporting conical apex can be derived from the techniques formerly used in phonograph needle fabrication. These items can be high-vacuum compatible, and the tiny apertures can act as a very precise grounded bearing surface for the conical tips of the shanks, which can simply be inserted or withdrawn from the aperture for the exchange of production parts. Because the conical surfaces are polished to a very fine point (typically ~3-5 um radius) and maintain circular cross sections down to near the apex, these can be made to pivot 360 degrees simply by being driven into tiny apertures (well below 300 um diameter, for instance) and rotated from the rear, such that the pivot point of the rotating part remains fixed, very precise and in close proximity to where the FIB operations to configure the high-resolution turned features occur. This concept is tantamount to "grabbing the rotating part by the nose", where the rotating part is the conically polished tip held in very precise location by the tiny, stable (well secured to dampen vibration), grounded aperture. Runout is thereby minimized to microscopic levels and continuous operation at high magnification becomes possible. This combination of parts forms one aspect of the present invention; the specific materials of which the conically polished shanks and the metals from which the apertures are fabricated (whether by laser or mechanical means) and the specific dimensions of the parts involved, such as the conical angle of the polished tips and the particular diameter of the aperture employed may vary considerably depending upon the project or application of the invention.

DESCRIPTION OF THE DRAWINGS

FIGS. 8-11 respectively illustrate side, front, top and rear views of a micro/nano machining lathe including the lathe front end assembly of FIG. 5 in preparation for operation;

DESCRIPTION OF THE PREFERRED EMBODIMENTS

Figure 1:
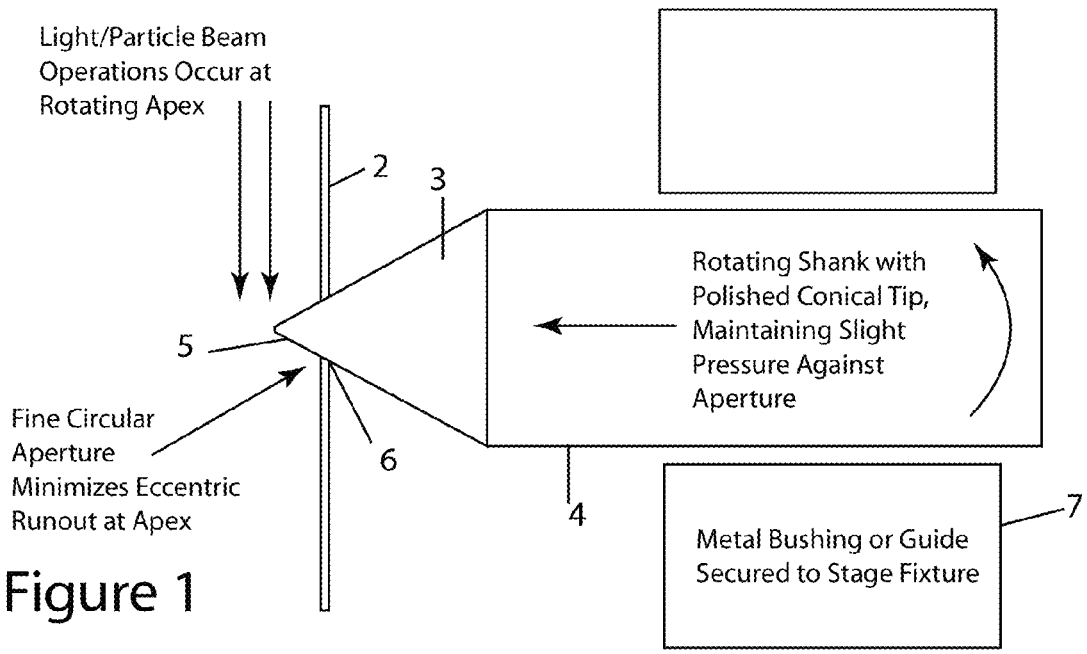
FIG. 1 is a schematic illustrating an exemplary Lathe head according to an embodiment.

In the following description, for purposes of explanation and not limitation, specific details are set forth, such as particular preferred embodiments, procedures, techniques, etc. in order to provide a thorough understanding of the present invention. However, it will be apparent to one skilled in the art that the present invention may be practiced in other embodiments that depart from these specific details.

Applicant has identified that the primary problem in creating microscopic turned features via FIB, laser or any other manufacturing method, is "runout," which can be thought of as the tendency of any rotating shaft or part to "wobble" or skew as it is turned, as a consequence of mechanical clearances for bushings, bearings, shafts, etc. and other mechanical imprecision and inaccuracy. While the axis of rotation can be expected to shift a tiny amount in any mechanical system involving rotating parts, even the tiniest eccentric deviation is magnified enormously during processing at the microscale.

By way of example, a runout of only 1 mil (25 um) may be perfectly acceptable for tangible machined parts emerging from a lathe in a machine shop but would be totally unacceptable for a turned part with a specified diameter of 1 um. Indeed, at the magnifications required to process microscopic parts via micromachining tools such as a FIB, such a turning part will escape the field of view and plane of focus entirely. In addition to runout from any motor or drive shaft, there is also the problem of fixturing parts such that they can be exchanged for production without introducing yet more runout to the part itself.

Certainly these concerns are only exacerbated by the fact that FIB and other micro processing requires that the raw material be of very small scale to begin with: due to the very tiny material removal rates of ion beam or laser ablation for example, modifications can only be accomplished in reasonable time when very tiny particles or points (down to for example ~3-5 um radius of curvature) of material, such as for example diamond, are provided for processing; thus, fixturing or even locating these tiny raw material items to begin with can be an onerous problem for the system operator. Further, at the microscopic scale in which micro machining operations occur, the rotating parts are grounded to offset charge accumulation and vibration is minimized to prevent high-magnification image distortion and disruption; at the same time, the rotating apparatus and parts must operate under high vacuum in the FIB or other micromachining specimen chamber.

Technical features described in this application can be used to construct various embodiments of apparatus, methods and systems for positioning turnable parts for nano/micro machining tools. Furthermore, technical features described in this application can be additionally or alternatively used to construct various embodiments of apparatus, methods and systems for nano/micro machining of turning parts.

In one approach an apparatus for a micro/nano machining lathe system is provided. The apparatus may comprise a turnable part supporting at one end thereof a polished conical tip of material; the conical tip being polished down to a microscopic apex. The apparatus may also comprise a lathe head for retaining in a micro/nano machining lathe system, the lathe head comprising a microscopic pivot aperture dimensioned for seating the conical tip concentric in the pivot aperture such that an apex of the conical tip protrudes through the aperture to a position in close proximity with the aperture.

The term "apex" is used herein in this application to mean the terminus of the conical tip.

The lathe head is composed of a fine aperture of small diameter. In one embodiment, the lathe head fine aperture may be approximately 300 microns or less. In one example, the fine aperture is made of thin Molybdenum or other metallic or conductive sheet, which is secured in place on a FIB (focused ion beam) stage mount. In one example, this aperture serves as the fixed pivot point for metallic shanks which bear conically-polished apices composed of diamond or other materials. The conical points of the shanks are inserted into the fine aperture and rotated by use of an electric motor or other means from the opposite end of the shanks through a fixed guide or bushing. FIB operations are then performed on the microscopic rotating apex which projects through the fine aperture, thereby minimizing eccentric runout of the turned parts at high magnification.

Specific reference to components, process steps, and other elements are not intended to be limiting. Further, it is understood that like parts bear the same reference numerals, when referring to alternate figures. It will be further noted that the figures are schematic and provided for guidance to the skilled reader and are not necessarily drawn to scale. Rather, the various drawing scales, aspect ratios, and numbers of components shown in the figures may be purposely distorted to make certain features or relationships easier to understand.

Reference will now be made to the drawings in which the various elements of embodiments will be given numerical designations and in which embodiments will be discussed so as to enable one skilled in the art to make and use the invention.

As indicated in FIG. 1, which is a schematic illustrating an exemplary Lathe head according to an embodiment, FIB operations occur at the rotating apex 5. A rotating metal shank 4 with polished conical diamond tip 3 is arranged to maintain slight pressure against the aperture 6. The fine circular aperture minimizes eccentric runout at the apex. In other examples, the conical tip material may be material other than diamond, such as but not limited to, ceramic, metallic, or gemstone material.

Figure 2:
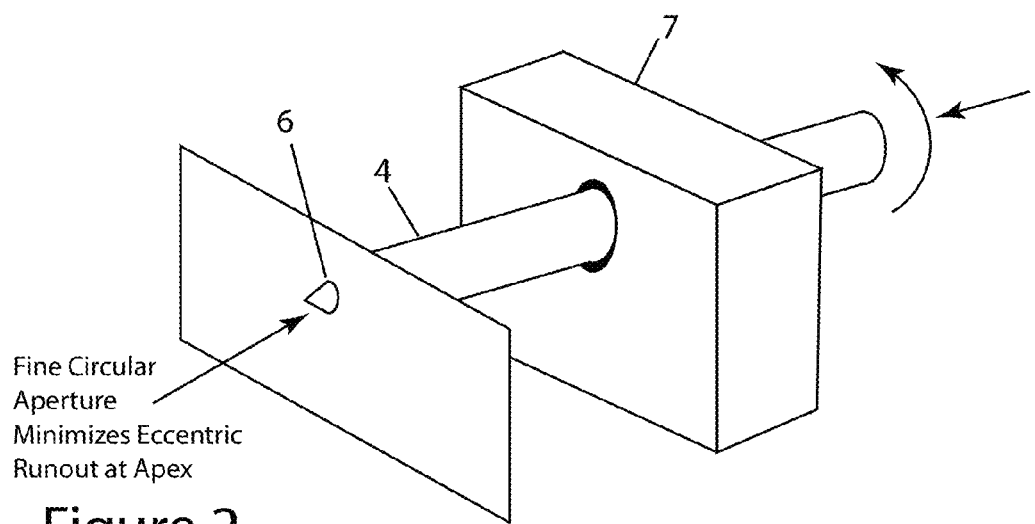
FIG. 2 is a schematic illustrating a perspective view of the exemplary Lathe head depicted in FIG. 1.
Figure 3:
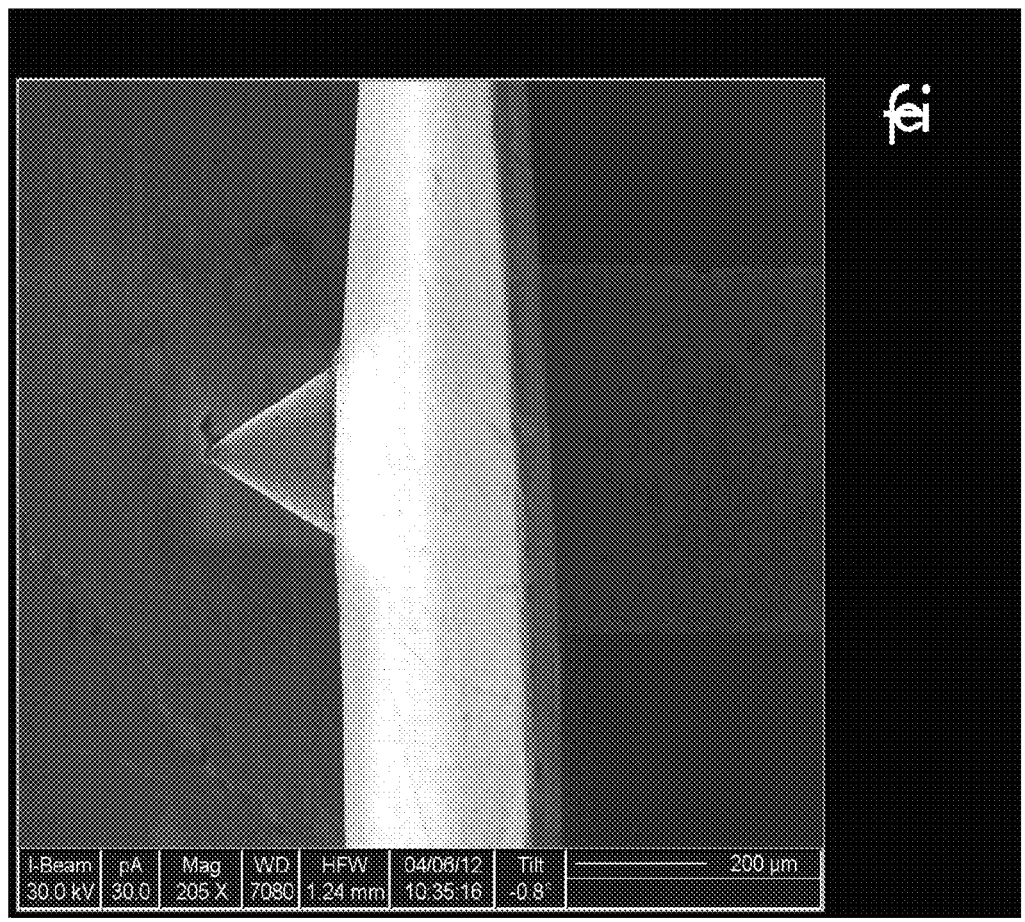
FIG. 3 illustrates a side view image of an exemplary Lathe Head in FIB with diamond-tipped titanium shank inserted according to an embodiment.
Figure 4A:
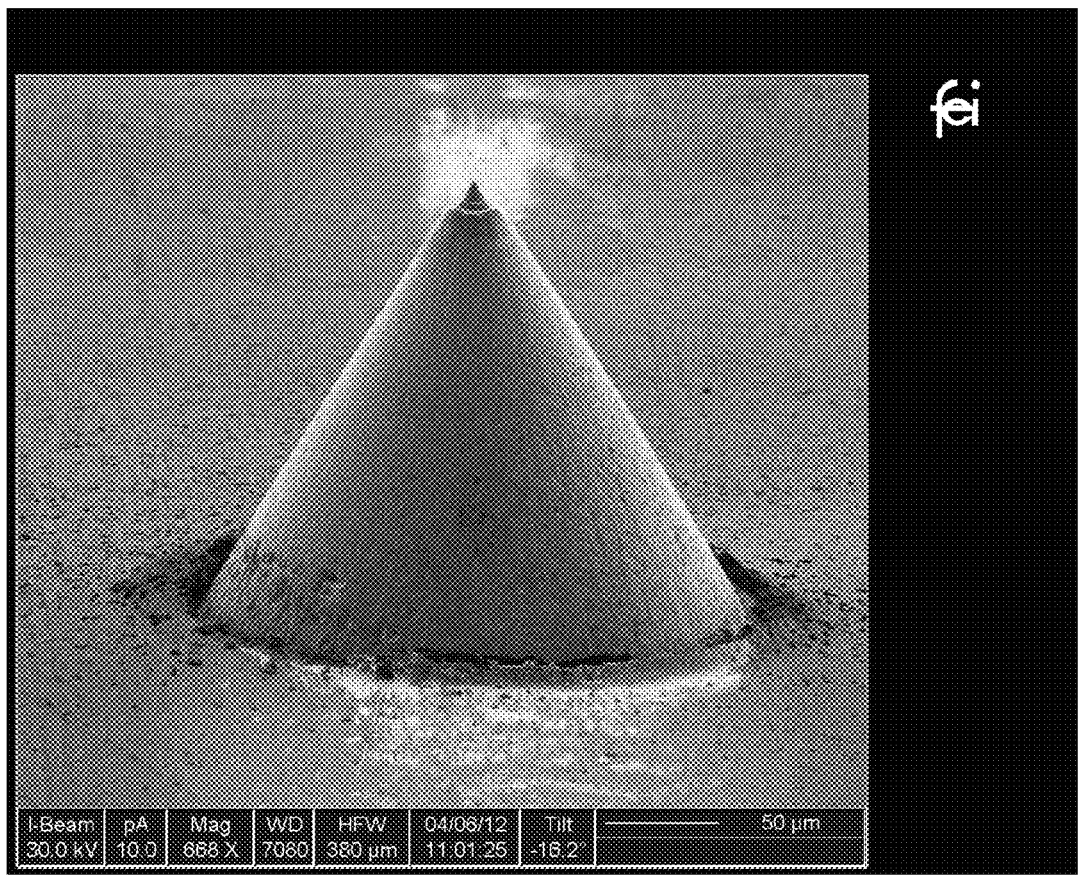
FIG. 4A illustrates a perspective view image of an exemplary Lathe Head in FIB showing protruding diamond conical point with micromachining at apex according to an embodiment.
Figure 4B:
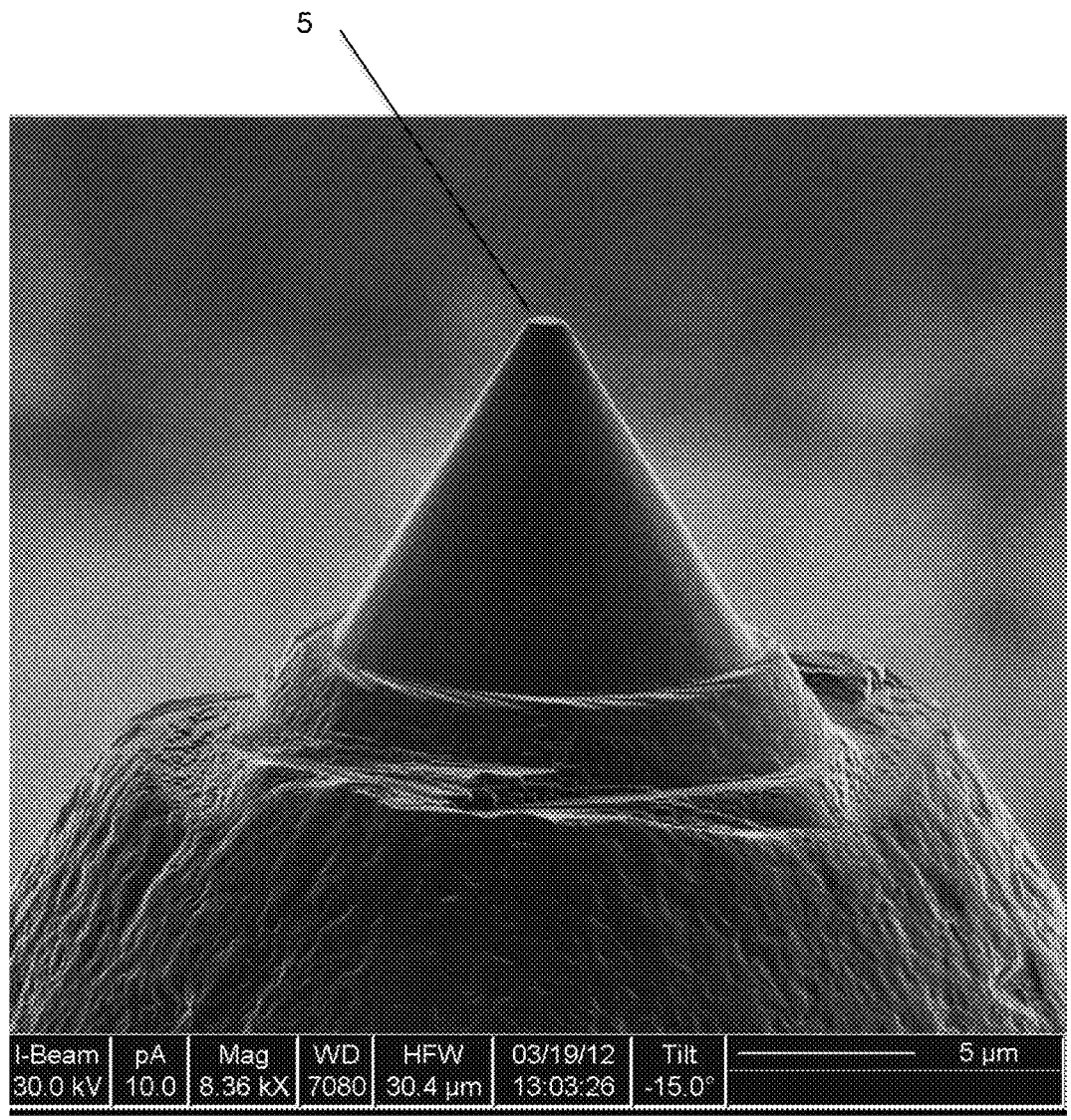
FIG. 4B illustrates a magnified perspective view of the apex of the conical tip shown in FIG. 4A.

As indicated in FIG. 2, which is a schematic illustrating the exemplary Lathe head of FIG. 1 in perspective view, the diamond-tipped metal shank 4 is driven from behind through a loose-fitting guide 7 to maintain general axial rotation and slight forward pressure in the direction of the pivot point, which is a fine metal microscopic aperture 6. The microscopic aperture may be approximately 300 um or less. Focused Ion Beam micromachining operations occur at the protruding apex of the polished diamond portion, which remains well-centered with minimum runout during rotation.

By driving the polished conical tip into the microscopic pivot aperture in the aforementioned manner and concurrently rotating the conical tip, the pivot point of the rotating conical tip remains fixed, very precise and in close proximity to where the micromachining operations are performed to configure the high-resolution turned features.

Figure 14:
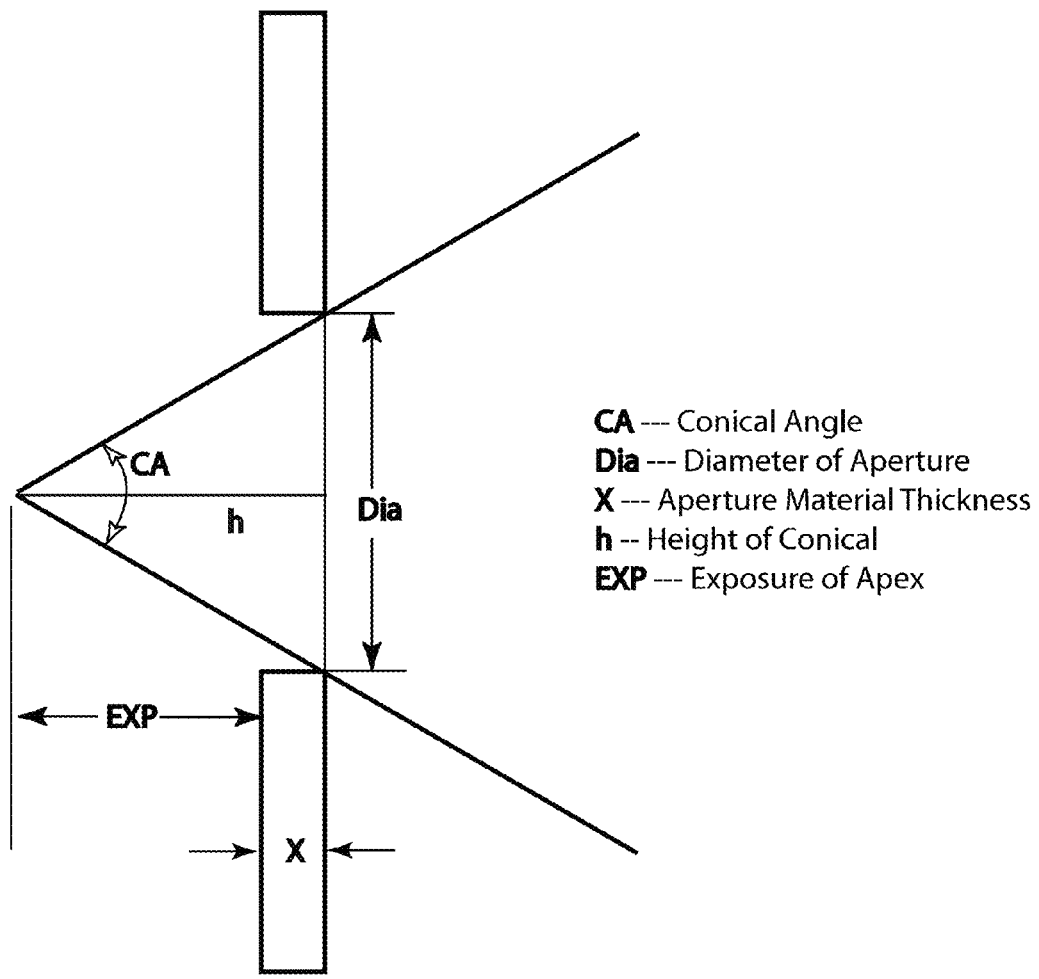
FIG. 14 is a schematic illustrating parameters of an exemplary aperture and conical tip according to one example.

The specific dimensions of the turning part and aperture, such as for example the conical angle of the polished tip and the particular diameter of the aperture employed may vary considerably depending upon the project or application of the invention. By way of example FIG. 14 is a schematic drawing illustrating parameters of an exemplary aperture and conical tip according to one example of an embodiment. A relationship between the exposure (Exp) of the apex, i.e. the amount by which the apex protrudes beyond the aperture to a position in close proximity with the aperture, and the conical tip height (h) and aperture thickness (x) is defined as follows: Exposure of aperture (Exp)=Height of conical tip (h)−aperture thickness (x).

Also, in other embodiments, turnable parts other than a shank may be utilized to carry the conical tip. For example, other elongated rigid members may be adopted. Any member elongated or otherwise that is capable of supporting the conical tip and permits the conical tip to be driven concentric into the aperture and axially rotated by a driver system in the manner explained in the described embodiments is envisaged.

In one example, the turnable parts are metal shanks typically bearing a gemstone material such as diamond or corundum attached at one end via a vacuum-brazing process; this end of the shank undergoes a three-step (coarse, medium, fine) diamond wheel grinding and polishing process of a sort which had been utilized in the phonograph needle fabrication industry and which continues to be employed in the manufacture of fine diamond-tipped tools. Further details of such exemplary fabrication techniques can be found in the publication of E. J. and M. V. Marcus, entitled "The Diamond as a Phonograph Stylus Material", Audio Engineering Society of Audio Engineering, pages 25-28, July 1950, the disclosure of which is incorporated herein by reference. Other fabrication methods that provide conical tips of the type discussed herein with reference to the embodiments are envisaged. By these methods, conical geometries of great precision and accuracy supporting highly circular cross sections down to approximately 25 um diameters are consistently supplied by the manufacturer.

In one example, the conical tip is ground and polished down to the apex. By way of example, the conical shanks can have a "matte polish". The conical tip may be polished down to for example a 320 grit diamond wheel, which feature about 0.0017" particle sizes. In other embodiments, the conical tip can be polished to a much higher degree for example when using nano radius conical tips and the degree of polishing is in no way limited to a matte polish. Any degree of polishing is envisaged that is sufficient to allow the conical tip to pivot through the aperture and axially rotate according to embodiments described herein.

Furthermore, mechanical details of the micro/nano machining lathe tools with which the apparatus shown in FIGS. 1 & 2 may be utilized, such as the variety of motor or control system, specimen stage adaptor platform, apparatus for parts exchange, vibration damping, etc. may vary depending on the micro/nano micro machining application.

Examples of such mechanical details will now be described. However, the person of ordinary skill would understand that in these examples the specific materials used in construction and their particular dimensions provided shall not be construed to define the invention per se, but only to serve as an example of one specific application of its principles.

Figure 5:
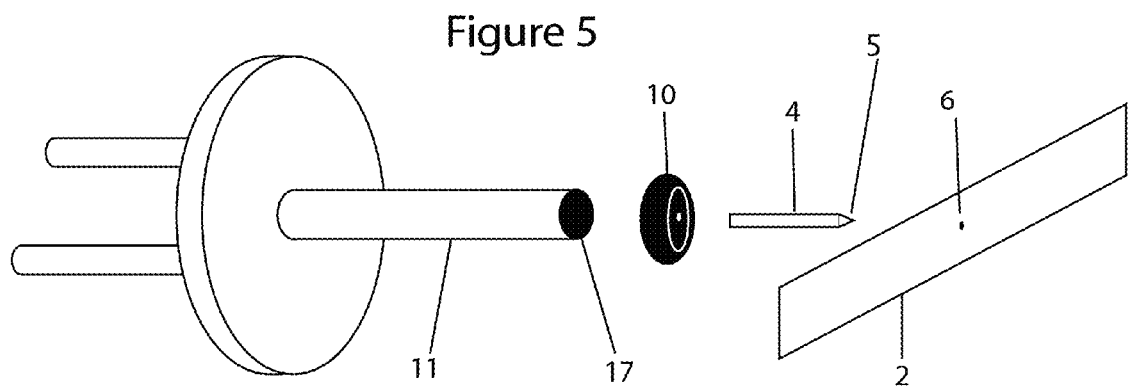
FIG. 5 illustrates an exploded view of parts of the apparatus for use in a micro/nano machine lathe according to one embodiment.

Referring to FIG. 5, which is an exploded view of parts for use in a micro/nano machining lathe tool, according to one embodiment, in this example the aperture strip 2 is made of metal, such as but not limited to a Molybdenum Aperture Strip and has a micro sized penetration that serves as the pivot aperture 6. For example, the sheet features can be a ~250 um diameter penetration. In one example, the sheet thickness can be about 50 um or thinner. Other sheet thicknesses can be used according to the selection of the parameters of the conical tip and aperture, such as illustrated in FIG. 14. The aperture openings are circular. In this example the aperture is a cylindrical hole but other apertures with circular cross sections are envisaged. The aperture can be manufactured by mechanical, laser or other means by known techniques. Aperture 6 provides the fixed pivot point for the turning part 4. In one example turning part 4 is a specially prepared metallic Shank of Titanium (or stainless steel, brass, etc.) to which a particle of diamond material (or corundum, VC, quartz, etc.) has been brazed and then polished down to a conical point or tip.

In one non-limiting example, the conical point is a 60-degree conical point with 3-5 um radius of curvature at the apex. As explained hereinbefore, other angled conical points or tips are envisaged that enable the conical tip to be seated concentric in the aperture and the conical tip to protrude through and beyond the aperture to a location in close proximity with the aperture. Furthermore, other radii of curvature at the apex are envisaged. In one example, the shank for the present device is, but not limited to, 6 mm in length and 500 um in diameter. Shanks of other lengths and diameter are envisaged according to the micro/nano machining application. The shank or other turning part is a consumable item and constitutes the product emerging from the device when operations are completed.

In the example of FIG. 5, there is provided a drive shaft 11 of a driver system for axially rotating the rear of the shank or other turning part and concurrently applying forward pressure to the rear and in the direction of the aperture 6. A viscous contact is provided to the rear of the drive shaft 11 for allowing some lateral shifting of the linkage to the rear of the shank. In one example, a small disc of silicone rubber with a pinhole at its center is fitted to the rear of the shank. This serves as a small friction plate 10 which engages the drive shaft. The distal end of the shaft carries a small bit of carbon tape 17. The carbon tape and silicone disc friction plate 10 form the viscous contact. This slippage prevents small axial misalignments from disrupting the pivot point contact between the shank conical tip and fixed aperture during operation.

Figure 6:
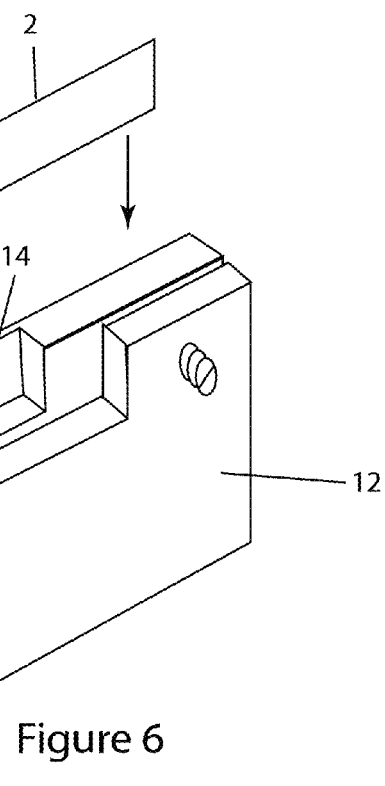
FIG. 6 illustrates an exemplary lathe front end assembly for use in a micro/nano lathe according to one embodiment.

Referring to FIG. 6, there is illustrated a lathe front end assembly for use in a micro/nano machining lathe according to one embodiment. The front end assembly retains the lathe head aperture strip 2. In one example, the front end assembly is a FIB front end assembly. The aperture strip 2 is secured to a stage fixture 12 in such a manner that the penetration is centered (to the greatest extent possible) along the axis of rotation of the drive shaft 11, which is concentric with the longitudinal axis of the shank and aperture. The aperture 2 is so secured at the front of the stage fixture by a screw plate or other securing means. A guide hole 14 is positioned to the rear of where the aperture strip is located. For example, the guide hole 14 is positioned approximately 3 mm to the rear of the strip. In one example, the guide hole is approximately 550 um in diameter and is provided for general alignment of the rotating shank towards the rear. This guide hole also is concentric with the axis of rotation of the drive shaft.

Figure 7:
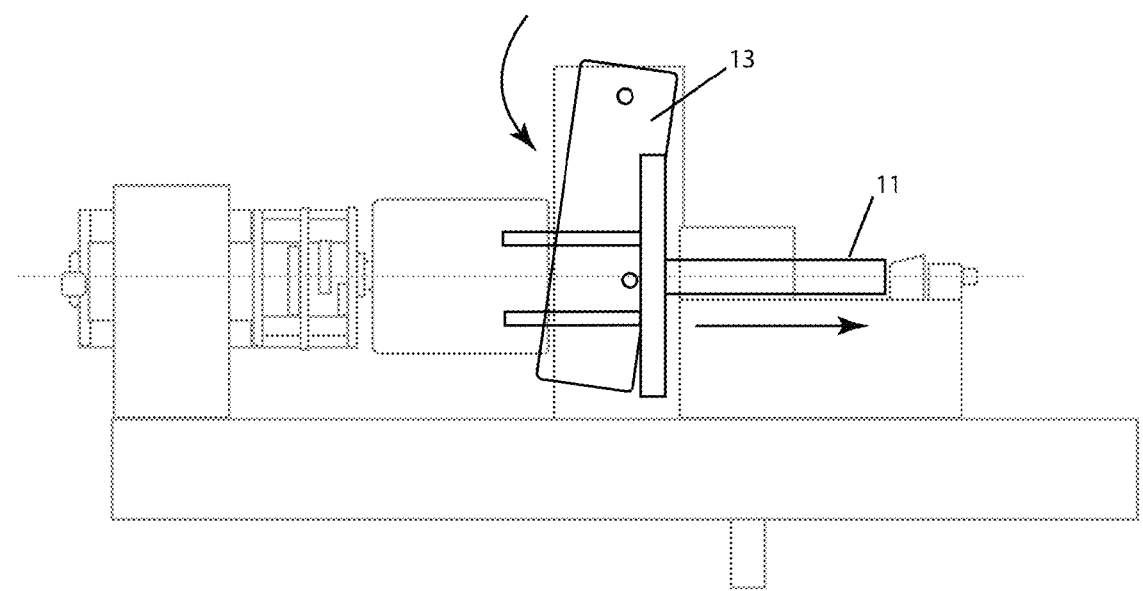
FIG. 7 illustrates an exemplary forward drive arrangement of a micro/nano lathe according to one embodiment.

Referring to FIG. 7, there is illustrated a forward drive arrangement for use in a micro/nano machining lathe according to embodiment. The forward drive arrangement together with the drive shaft serve as a forward pressure applicator for applying forward pressure to the rear of the turnable part 4 in the direction of the aperture 6. One example of a forward pressure applicator is a gravity drive bar 13 which is arranged to be pivotable from the stage fixture in such a manner as to gently push the drive shaft 11 forward during operation, thereby maintaining contact between the conical tip of the shank and the edges of the aperture. Other types of forward pressure applicators can be used such as mechanical springs, permanent magnets set on the drive and turnable part to repel each outer, an electrical linear actuator, piezo device, pneumatic or hydraulic applicator etc.

An exemplary micro/nano machining lathe that utilizes the parts of FIG. 5, front end assembly of FIG. 6, and forward drive arrangement of FIG. 7 is shown in preparation for operation in FIGS. 8-11. In the example of FIGS. 8-11 the lathe is a FIB lathe. However, in other examples, the lathe may be a laser beam or other nano-micro machining lathe.

A vacuum compatible gearhead motor 15 (which is wired to a control box via a feed-through adaptor plate into the FIB vacuum chamber) is fitted with a simple paddle crank 17 which engages forks projecting rearward from the drive shaft 11, allowing the shaft to be retracted through the simple drive bushing 16 to enable the turnable part 4 (in this example the shank) and friction plate assembly 10 to be inserted or removed through the guide hole 14 of the front end assembly. The guide hole 14 directs the conical tip of the shank or other rotatable part to engage the aperture 6. This is how production parts are exchanged for FIB or other nano/micro machining operations. Lowering the gravity drive bar 13 to engage the drive shaft 11 maintains pressure on the shank and friction plate assembly in order to keep the conical tip of the shank pivoting through the aperture 6 as it is turned.

A method for micro/nano machining according to one embodiment will now be described with reference to the general flow chart of FIG. 13 and other accompanying drawings. The method 130 initiates by providing a turnable part supporting at one end thereof a polished conical tip of material (step 131). One example of such a turnable part is the shank 4. The conical tip has been polished down to a microscopic apex 5. The conical tip is then seated, apex first, concentric in the pivot aperture 6 of the lathe head such that the apex of the conical tip protrudes through the aperture to a position in close proximity with the aperture (step 132), such as discussed with reference to the aforementioned embodiments of FIGS. 1-4 and 5-11. The lathe head is fixed in position by suitable securing means such as the securing means shown by way of example in the front end assembly of FIG. 6 or by other means. The turnable part, including the conical tip seated in the pivot aperture, is then axially rotated (step 133), for example as indicated in FIGS. 1 and 2. The turnable part can be axially rotated for example by the driver system of the lathe shown in FIG. 8 or by other means. Forward pressure is concurrently axially applied to the conical tip in the direction of the pivot aperture such that during rotation eccentric runout at the apex of the rotating conical tip is substantially minimized (step 134). The concurrent forward pressure can be applied for example using the forward pressure applicator described with reference to FIG. 7 or by other means.

Figure 12:
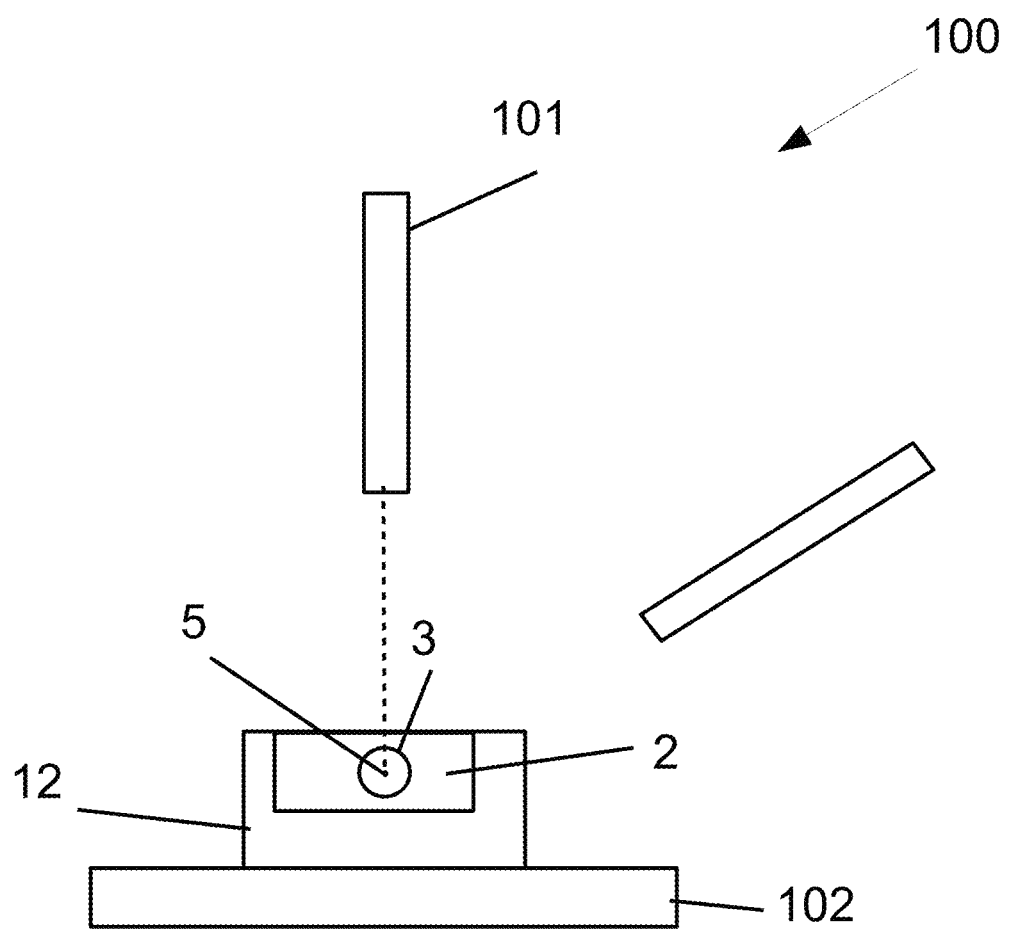
FIG. 12 illustrates in general schematic diagram form an exemplary light/particle beam machining system incorporating the lathe and parts of FIGS. 5-11 according to one embodiment.

A side view of a micro/nano machining light/particle beam machining apparatus 100 in general block diagram form according to one embodiment is depicted in FIG. 12. In this example, the light/particle beam machining apparatus is a FIB machining system however in other embodiments, the machining apparatus can be a laser beam machining system or other particle beam and/or light beam machining system.

As generally indicated in FIG. 12. the lathe and associated parts of FIGS. 5-11 are mounted on a focused ion beam table 102 and prepared for operation as described hereinbefore. A FIB source 101 is arranged to direct a fib beam onto the rotating conical tip 3 to machine nano/micro features. In one example, the FIB source 101 is arranged such that the source provides a vertical FIB beam above the protruding conical tip. The vertical beam can be arranged perpendicular to the rotation axis of the conical tip and aligned to impinge about the apex of the tip.

Figure 13:
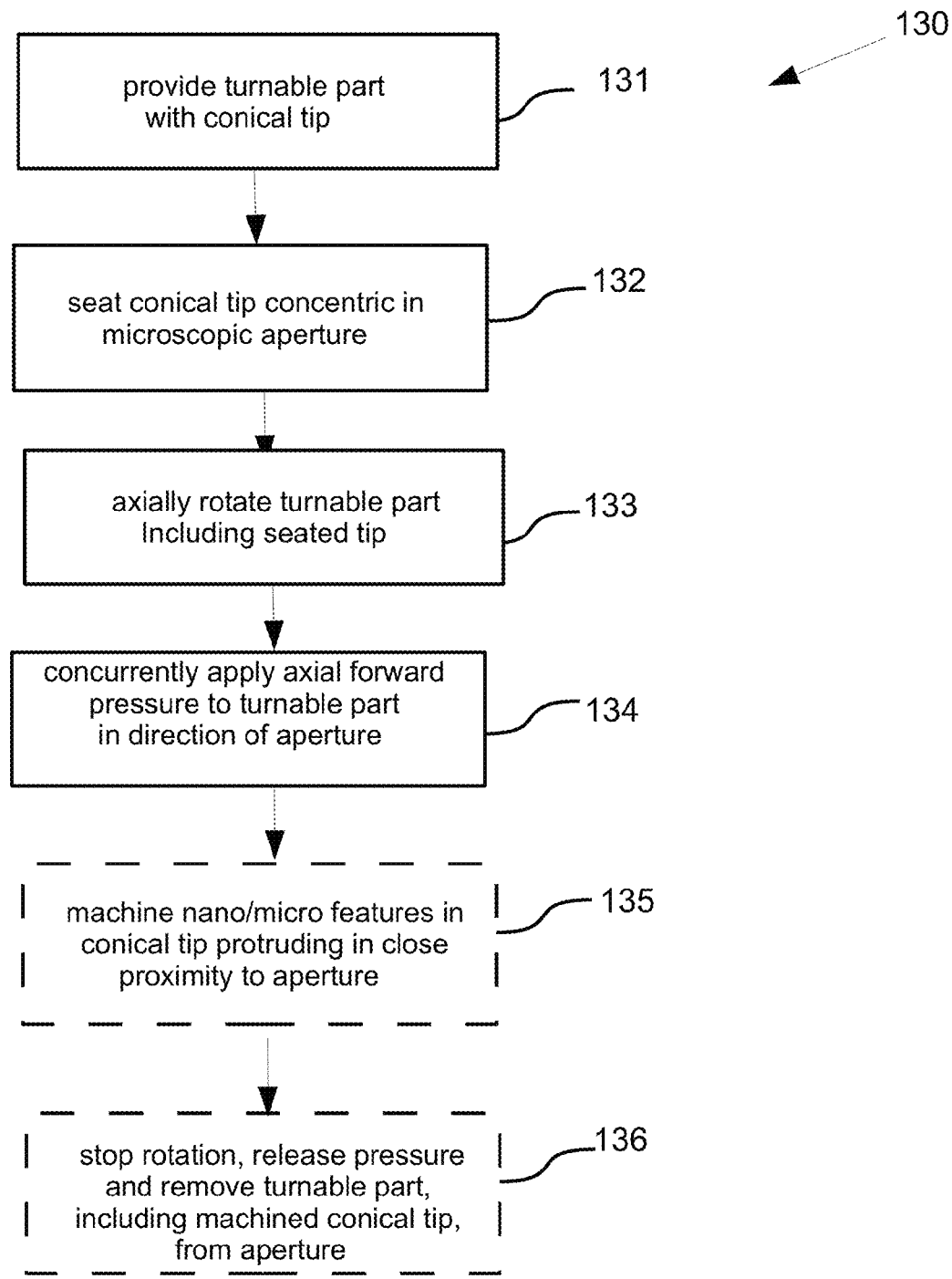
FIG. 13 illustrates in general flow chart form a method for use in nano/micro machining system according to one or more embodiments.

In one embodiment, method 130 for micro/nano machining can include directing a micro/nano machining light/particle beam onto the rotating conical tip that is being driven into the aperture by the forward pressure and performing micro/nano machining thereof utilizing the beam whilst the pivot point of the conical tip apex remains substantially fixed (see optional step 135 of FIG. 13). The process can be performed for example utilizing the FIB system of FIG. 12 or by utilizing another type of nano/micro machining system incorporating the lathe parts of the described embodiments. Thereafter, once machining of the conical tip has been performed, the turnable part, including the conical tip, can be simply removed by stopping rotation of the turnable part, releasing the forward pressure and removing the turnable part from the aperture (step 136). In the lathe system of FIGS. 8-11, this is achieved by stopping the drive shaft motor, releasing the drive shaft 11 and removing the friction plate assembly and turnable shank 4 through the guide hole 14.

While preferred embodiments of the present invention have been described and illustrated in detail, it is to be understood that many modifications can be made to the embodiments, and features can be interchanged between embodiments, without departing from the spirit of the invention.

What is claimed is:

1. A method for micro/nano machining; the method comprising
providing a turnable part carrying at one end a conical tip of material; said conical tip being polished down to a microscopic apex;
seating, apex first, the conical tip in one end of a pivot aperture of a lathe head and concentric with said aperture such that the apex protrudes from the other end of the aperture to a position in close proximity with said aperture;
retaining said lathe head in a micro/nano machining lathe system;
axially rotating said turning part, including said conical tip seated in said aperture; and
concurrently applying forward pressure to said axially rotating conical tip seated in said pivot aperture and in the direction of the aperture;
whereby eccentric runout at the apex of said rotating conical tip is substantially minimized such that a pivot point of said protruding apex remains fixed for micro/nano machining of said apex.

2. The method of claim 1, wherein seating said conical tip in one end of said pivot aperture comprises removeably seating said conical tip in said pivot aperture.

3. The method of claim 1, wherein seating, apex first, the conical tip in one end of the pivot aperture of a lathe head comprises seating the conical tip in one end of a conductive pivot aperture.

4. The method of claim 1, wherein seating, apex first, the conical tip in one end of the pivot aperture of a lathe head comprises seating the conical tip in one end of a pivot aperture of diameter of about 300 um or less.

5. The method of claim 1, further comprising directing a micro/nano machining beam on said rotating protruding apex.

6. A method for micro/nano machining; the method comprising
providing a turnable part supporting at one end thereof a polished conical tip of material; said conical tip being polished down to a microscopic apex;
seating, apex first, the conical tip concentric in a pivot aperture of a lathe head such that the apex of said conical tip protrudes through said aperture to a position in close proximity with said aperture; and
axially rotating said turnable part, including said conical tip seated in said pivot aperture,
concurrently applying forward pressure to say conical tip in the direction of the pivot aperture such that during rotation eccentric runout at the apex of said rotating conical tip is substantially minimized.

7. The method of claim 6, further comprising
directing a micro/nano machining light/particle beam onto said rotating conical tip and performing micro/nano machining thereof utilizing said beam whilst the pivot point of said conical tip apex remains substantially fixed.

8. The method of claim 6, further comprising stopping rotation of said turnable part, releasing the forward pressure applied to said turnable part; and removing said turnable part including said machined conical tip from said aperture.

* * * * *